(12) United States Patent
Douglass et al.

(10) Patent No.: US 10,598,703 B2
(45) Date of Patent: Mar. 24, 2020

(54) ELECTRIC FUSE CURRENT SENSING SYSTEMS AND MONITORING METHODS

(71) Applicant: EATON INTELLIGENT POWER LIMITED, Dublin (IE)

(72) Inventors: Robert Stephen Douglass, Wildwood, MO (US); Santosh Kumar Sharma, Pune (IN); Ameer Khan, Pune (IN); Hrushikesh Arun Barve, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 176 days.

(21) Appl. No.: 14/803,315

(22) Filed: Jul. 20, 2015

(65) Prior Publication Data
US 2017/0023618 A1    Jan. 26, 2017

(51) Int. Cl.
*G01R 19/32* (2006.01)
*G01R 15/14* (2006.01)
(Continued)

(52) U.S. Cl.
CPC ............ *G01R 19/32* (2013.01); *G01R 1/04* (2013.01); *G01R 15/146* (2013.01); *G01R 19/0092* (2013.01); *G01R 27/16* (2013.01); *G01R 31/07* (2013.01); *G01R 31/08* (2013.01); *G06K 7/10366* (2013.01); *G06K 7/1413* (2013.01); *G11C 17/16* (2013.01); *G11C 17/18* (2013.01); *G11C 29/027* (2013.01); *G11C 29/50008* (2013.01); *H01H 85/048* (2013.01); *H01H 85/165* (2013.01); *H02H 3/046* (2013.01); *H02H 3/08* (2013.01); *H02H 3/085* (2013.01); *G11C 2029/0409* (2013.01); *H02H 1/0007* (2013.01); *H02H 1/0038* (2013.01)

(58) Field of Classification Search
CPC ........ G01R 15/146; G01R 1/04; G01R 27/16; G01R 19/0092; G11C 17/16; G11C 17/18; G11C 29/50008; G11C 29/027; G11C 2029/0409
See application file for complete search history.

(56) References Cited

U.S. PATENT DOCUMENTS

| 2,856,488 A | 10/1958 | Kozacka |
| 3,684,923 A | 8/1972 | Keeler |
| (Continued) | | |

FOREIGN PATENT DOCUMENTS

| CN | 101789578 B | 7/2012 |
| DE | 102004002360 A1 | 8/2005 |
| (Continued) | | |

OTHER PUBLICATIONS

International Search Report and Written Opinion of International Application No. PCT/US2016/041458. Oct. 28, 2016, 14 pages.

*Primary Examiner* — Akm Zakaria
(74) *Attorney, Agent, or Firm* — Armstrong Teasdale LLP

(57) ABSTRACT

Electrical current sensing and monitoring methods include connecting a compensation circuit across a conductor having a non-linear resistance such as a fuse element. The compensation circuit injects a current or voltage to the conductor that allows the resistance of the conductor to be determined. The current flowing in the conductor can be calculated based on a sensed voltage across the conductor once the resistance of the conductor has been determined.

26 Claims, 6 Drawing Sheets

(51) Int. Cl.

| | |
|---|---|
| *G01R 19/00* | (2006.01) |
| *G01R 1/04* | (2006.01) |
| *G01R 27/16* | (2006.01) |
| *G11C 29/02* | (2006.01) |
| *G11C 29/50* | (2006.01) |
| *G11C 17/16* | (2006.01) |
| *G11C 17/18* | (2006.01) |
| *G01R 31/07* | (2006.01) |
| *G01R 31/08* | (2020.01) |
| *H02H 3/08* | (2006.01) |
| *H02H 3/04* | (2006.01) |
| *G06K 7/10* | (2006.01) |
| *G06K 7/14* | (2006.01) |
| *H01H 85/048* | (2006.01) |
| *H01H 85/165* | (2006.01) |
| *G11C 29/04* | (2006.01) |
| *H02H 1/00* | (2006.01) |

(56) References Cited

U.S. PATENT DOCUMENTS

| | | |
|---|---|---|
| 3,958,206 A | 5/1976 | Klint |
| 4,661,807 A | 4/1987 | Panaro |
| 4,994,779 A | 2/1991 | Douglass |
| 5,153,802 A | 10/1992 | Mertz et al. |
| 5,418,487 A | 5/1995 | Armstrong, II |
| 5,453,696 A | 9/1995 | Becker et al. |
| 5,519,561 A | 5/1996 | Mrenna et al. |
| 5,712,610 A | 1/1998 | Takeichi |
| 5,731,733 A | 3/1998 | Denham |
| 5,831,507 A | 11/1998 | Kasamatsu et al. |
| 5,831,509 A | 11/1998 | Elms et al. |
| 5,896,059 A | 4/1999 | Durham et al. |
| 6,054,330 A | 4/2000 | Phipps et al. |
| 6,346,845 B1 | 2/2002 | Choi |
| 6,424,035 B1 | 7/2002 | Sapp et al. |
| 6,492,747 B1 | 12/2002 | Hoffmann |
| 6,498,526 B2 | 12/2002 | Lim et al. |
| 6,541,983 B2 | 4/2003 | Khoury |
| 6,583,977 B1 | 6/2003 | Oglesbee |
| 6,670,843 B1 * | 12/2003 | Moench ............... G11C 17/18 327/525 |
| 6,686,744 B1 | 2/2004 | Tinsley |
| 7,098,721 B2 | 8/2006 | Ouellette et al. |
| 7,109,877 B2 | 9/2006 | Cuk |
| 7,119,603 B2 | 10/2006 | Newman |
| 7,153,712 B1 | 12/2006 | Sidhu et al. |
| 7,170,299 B1 | 1/2007 | Anand et al. |
| 7,190,629 B2 | 3/2007 | Pan et al. |
| 7,215,175 B1 | 5/2007 | Mandal et al. |
| 7,295,057 B2 | 11/2007 | Bhushan et al. |
| 7,376,036 B2 | 5/2008 | Ueda |
| 7,400,482 B2 | 7/2008 | Parker |
| 7,518,899 B2 | 4/2009 | Perry et al. |
| 7,573,273 B2 | 8/2009 | Yanagida |
| 7,576,635 B2 | 8/2009 | Bender et al. |
| 7,609,577 B2 | 10/2009 | Anand et al. |
| 7,733,096 B2 | 6/2010 | Lin et al. |
| 7,791,972 B2 | 9/2010 | Ouellette et al. |
| 7,969,275 B2 | 6/2011 | Hartzog |
| 7,978,493 B1 | 7/2011 | Tan et al. |
| 8,030,181 B2 | 10/2011 | Chung et al. |
| 8,031,453 B2 | 10/2011 | Nelson et al. |
| 8,032,045 B2 | 10/2011 | Chae et al. |
| 8,035,943 B2 | 10/2011 | Turpin et al. |
| 8,036,005 B2 | 10/2011 | Gebert |
| 8,140,278 B2 | 3/2012 | Rodseth et al. |
| 8,189,362 B2 | 5/2012 | Tan et al. |
| 8,207,783 B2 | 6/2012 | Liao et al. |
| 8,208,336 B2 | 6/2012 | Do |
| 8,213,256 B2 | 7/2012 | Kim et al. |
| 8,265,506 B2 | 9/2012 | Young-Min et al. |
| 8,349,665 B2 | 1/2013 | Kim |
| 8,351,291 B2 | 1/2013 | Lee et al. |
| 8,400,745 B1 | 3/2013 | Zansky et al. |
| 8,427,857 B2 | 4/2013 | Chen et al. |
| 8,587,912 B2 | 11/2013 | Jezierski et al. |
| 8,686,596 B2 | 4/2014 | Huss et al. |
| 8,724,280 B2 | 5/2014 | Andersson et al. |
| 8,762,083 B2 | 6/2014 | Rodseth et al. |
| 8,804,448 B2 | 8/2014 | Park et al. |
| 8,929,046 B2 | 1/2015 | Cyuzawa et al. |
| 8,953,294 B2 | 2/2015 | Graf et al. |
| 8,964,444 B2 | 2/2015 | Hall et al. |
| 2005/0083167 A1 | 4/2005 | Ackermann |
| 2005/0280405 A1 | 12/2005 | Bray |
| 2007/0218258 A1 * | 9/2007 | Nees ..................... H05K 3/102 428/209 |
| 2007/0278617 A1 * | 12/2007 | Okada ................... G11C 17/18 257/529 |
| 2008/0204961 A1 * | 8/2008 | O'Leary ................ H02H 3/006 361/104 |
| 2009/0224323 A1 | 9/2009 | Im et al. |
| 2010/0164677 A1 | 7/2010 | Yang |
| 2010/0283491 A1 * | 11/2010 | Zurek ..................... G01R 27/20 324/713 |
| 2011/0026177 A1 | 2/2011 | Atluri et al. |
| 2011/0140902 A1 * | 6/2011 | Huss ...................... H01H 85/32 340/638 |
| 2011/0163837 A1 * | 7/2011 | Darr ........................ H01H 1/20 337/186 |
| 2012/0043988 A1 | 2/2012 | Ramsey et al. |
| 2012/0127621 A1 | 5/2012 | Knapp, Jr. et al. |
| 2014/0012520 A1 | 1/2014 | Zhao et al. |
| 2014/0055899 A1 * | 2/2014 | Gruber .................... H02H 3/08 361/91.6 |
| 2014/0062492 A1 | 3/2014 | Boxshall et al. |
| 2014/0191772 A1 * | 7/2014 | Hetzler .................. G01R 1/203 324/705 |
| 2014/0247057 A1 | 9/2014 | Rodseth et al. |
| 2014/0369105 A1 | 12/2014 | Lin et al. |
| 2016/0327593 A1 * | 11/2016 | Labbe .................. G01R 15/185 |

FOREIGN PATENT DOCUMENTS

| | | |
|---|---|---|
| DE | 202009002852 U1 | 7/2009 |
| DE | 102012014969 A1 | 1/2014 |
| EP | 342101 A1 | 11/1989 |
| EP | 0962953 B1 | 8/2005 |
| EP | 1536537 B1 | 1/2012 |
| FR | 2689677 A1 | 10/1993 |
| GB | 2280960 A | 2/1995 |
| JP | 53115053 A | 10/1978 |
| JP | 581942 | 1/1983 |
| JP | 0389864 A | 4/1991 |
| JP | 0757613 A | 3/1995 |
| JP | 2000295777 A | 10/2000 |
| JP | 2005197104 A | 7/2005 |
| JP | 4272044 B2 | 6/2009 |
| JP | 4772833 B2 | 9/2011 |
| KR | 20080015215 A | 2/2008 |
| KR | 2008046510 A | 5/2008 |
| WO | 2006002446 A1 | 1/2006 |
| WO | 2010055430 A2 | 5/2010 |
| WO | 2010061047 A1 | 6/2010 |
| WO | 2011102777 A1 | 8/2011 |
| WO | 2013167127 A1 | 11/2013 |

\* cited by examiner

ELECTRIC FUSE CURRENT SENSING SYSTEMS AND MONITORING METHODS

BACKGROUND OF THE INVENTION

The field of the invention relates generally to electrical power distribution systems, and more specifically to systems and methods of sensing and monitoring electrical current flow through a conductor in an electrical circuit.

In electrical products and systems of various types, current sensing is performed for a variety of reasons. Current sensing and monitoring facilitates oversight and control of equipment and processes in various aspects, as well as facilitates circuit protection functionality. Various different types of contact and non-contact current sensors are presently used today, including but not necessarily limited to resistance shunts, current transformers (CTs), hall-effect sensors and fiber-optic current sensors (FOCS) that use the magneto-optic effect (Faraday effect).

In many residential-type electrical power systems where current sensing is required, the relative cost of conventional current sensors is high and as such the use of current sensors has been limited for residential applications. For electrical products including current sensing capability, the cost of the current sensor components can account for as much as 50% of the total product cost. For industrial and commercial-type products requiring current sensing, the sensing components can account for as much as 20% of the total system cost. The relatively high cost of presently utilized current sensor technology is an impediment to otherwise beneficial adoption of current sensing on a broader scale in the electrical industry. Lower cost and/or simpler current sensing solutions are accordingly desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
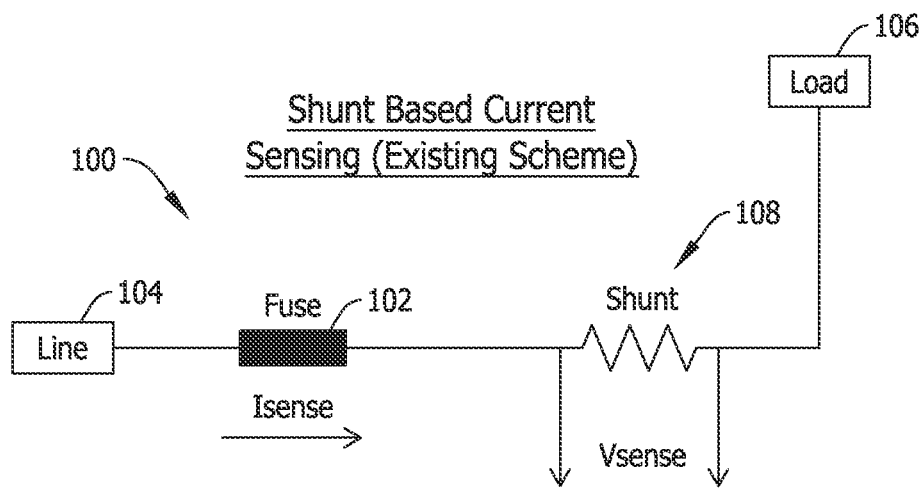
FIG. 1 is a partial circuit schematic of a portion of an electrical power system illustrating a conventional current sensing technique.

FIG. 1 is a partial circuit schematic of a portion of an electrical power system 100 illustrating a conventional current sensing technique sometimes referred to as shunt based current sensing.

As shown in FIG. 1, the power system 100 includes an electrical fuse 102 connected between line side circuitry 104 and load side circuitry 106. The fuse 102 includes a housing and a conductive fuse element that is structurally configured to melt, disintegrate, vaporize or otherwise structurally fail in response to a predetermined overcurrent condition and effectively create an open circuit between the line side circuitry 104 and the load side circuitry 106. The load side circuitry 106 is therefore protected by the fuse 102 and its fuse element that electrically isolates the load side circuitry 106 when the fuse element is exposed to overcurrent conditions as the fuse element fails to conduct electrical current any longer through the fuse 102, thereby preventing otherwise damaging current from flowing to the line side circuitry 106. The opening of the fuse element in response to the overcurrent condition is permanent and the fuse 102 must be replaced with another fuse 102 to restore the electrical connection between the line side circuitry 104 and the load side circuitry 106.

As also shown in FIG. 1, a resistive shunt 108 is connected in series with the fuse 102 in the electrical power system 100. By monitoring or sensing a voltage $V_{sense}$ across the shunt 108, the current $I_{sense}$ flowing though the fuse 102 can be easily determined from Ohm's law (V=I/R). Ideally, the resistive shunt 108 has a broad linear resistance band allowing for direct conversion of the voltage $V_{sense}$ to the current $I_{sense}$. The broad linear resistance band in the resistive shunt 108, which is typically not available in other components in the electrical system, is highly desired and accordingly the resistive shunt 108 is rated for full current and is manufactured with high precision. The resistive shunt 108 is therefore a relatively expensive, although effective current sensing solution. In an electrical power system 100 including many electrical fuses 102, the costs of providing resistive shunts are multiplied and can be substantial.

Other current sensors are known that may be utilized in lieu of the resistive shunt 108 described, including those mentioned above, but they tend be bulkier and/or more expensive than the resistive shunt 108 and therefore have not completely met the need for compact and lower cost solutions.

Exemplary embodiments of systems and methods are described herein below that facilitate a compact, reliable and cost effective current sensing, monitoring and control functions and advanced capabilities in electrical power systems. This is achieved, as explained in detail below, by connecting a compensation circuit across a conductor having a non-linear resistance such as a fuse element. The compensation circuit injects a current or voltage to the conductor that allows the resistance of the conductor to be determined. The current flowing in the conductor can be calculated based on a sensed voltage across the conductor once the resistance of the conductor has been determined. Method aspects will be in part apparent and in part explicitly discussed in the following description.

Figure 2:
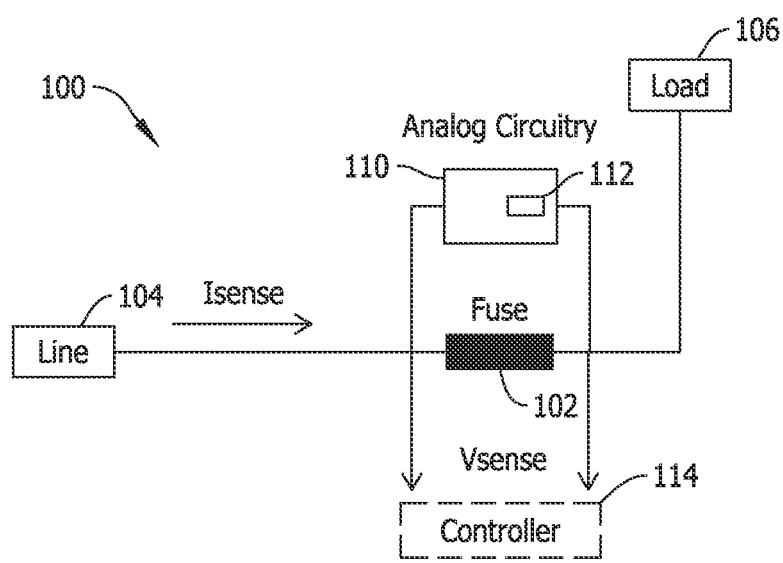
FIG. 2 is a partial circuit schematic of a portion of an electrical power system illustrating a first exemplary current sensing technique according to an embodiment of the present invention.

FIG. 2 illustrates a first exemplary current sensing technique according to an embodiment of the present invention. Comparing FIGS. 1 and 2, it is seen that the resistive shunt 108 is eliminated and the voltage $V_{sense}$ is derived directly across the fuse 102 and the current $I_{sense}$ may likewise be determined without involving a relatively expensive series-connected shunt 108 as shown in FIG. 1. The elimination of the resistive shunt 108, as afforded by the present invention, is advantageous beyond cost reduction. Elimination of the resistive shunt also saves physical space, and in applications where many fuses are utilized in a common location, including but not limited to combiner boxes, the size of the combiner box can be reduced. Likewise, a size of a panelboard or fuse block can be reduced via elimination of resistive shunts while still providing current sensing capability and advanced fuse status features, abnormal fuse detection and alarms, etc.

Sensing the voltage $V_{sense}$ directly across the fuse 102 to determine the current $I_{sense}$ introduces complications that are addressed by compensation circuitry 110. Specifically, the fuse element in the fuse 102 exhibits a non-linear resistance that unlike the resistive shunt 108 (FIG. 1) precludes a simple and direct application of Ohm's law to calculate the current $I_{sense}$ because the resistance of the fuse element in the fuse 102 is not constant in use.

The compensation circuitry 110 may accordingly include a controller 112 that measures the fuse element resistance at periodic intervals to account for variations in fuse resistance. Alternatively, the controller 112 may be provided in a sub-metering module (SMM) in, for example a combiner box including the fuse 102. That is, the controller 112 need not be a part of the compensation circuitry 110 itself in all embodiments, but instead may be separately provided. The voltage $V_{sense}$ in some embodiments may be input to another optional controller 114 that calculates the current $I_{sense}$ It is understood, however, that the functionality of the controllers 112, 114 shown may be combined into a single controller if desired.

The controllers 112 and/or 114 may be processor-based control devices. As used herein, the term "processor-based" shall refer not only to controller devices including a processor or microprocessor, but also to other equivalent elements such as microcomputers, programmable logic controllers, reduced instruction set (RISC) circuits, application specific integrated circuits and other programmable circuits, logic circuits, equivalents thereof, and any other circuit or processor capable of executing the functions described below. The processor-based devices listed above are exemplary only, and are thus not intended to limit in any way the definition and/or meaning of the term "processor-based".

The technique shown in FIG. 2 recognizes that the fuse 102, as are all electrical fuses, is essentially a calibrated resistor. Because a resistor drops a voltage during operation, knowing the resistance of the fuse element in the fuse 102 (as determined by one of the controllers 112, 114) and also knowing the voltage $V_{sense}$, the current $I_{sense}$ can be calculated using relationships derived from Ohms Law while achieving a relatively smaller and more cost effective current sensing system than that shown in FIG. 1. The current sensing technique shown in FIG. 2, and also further described below in exemplary implementations in FIGS. 3-6 can be applied on practically any type of fuse with advantageous effect.

In contemplated embodiments, algorithms are utilized to translate the non-linear response of the fuse element into accurate current readings. Unique non-linear fuse coefficients can then be coded onto or into the individual fuse 102 with, for example, an RFID tag or bar code label. As also described below, a fuse reader may alternatively be integrated into a housing of a fuse holder or a housing of a disconnect switch, sometimes referred to as a base, along with current monitor electronics. Since the fuse 102 introduces non-linear resistance aspects to the current monitoring equation, electronic circuit assisted sensing or acquisition is proposed along with algorithms to compensate for non-linear fuse resistance.

While the concepts described are illustrated in the context of the fuse 102 being utilized to sense current, the concept illustrated in FIG. 2 could alternatively be applied to other conductive elements besides a fuse. The use of circuit elements like fuses, circuit breaker contacts, electrical connections and all other components that introduce series resistance into the circuit can be effectively applied with an accompanying compensation circuit operating. Since each circuit element used for current sensing can have its own unique and individual variables and properties, a scheme for coding these unique variables and properties with the circuit element is required for proper and accurate translation of the resistor voltage to a current measurement. A coding scheme may include, as mentioned above, RFID tagging and or bar code labeling. It shall be understood that the proposed concept shown in FIG. 2 can be used for both direct current (DC) and alternating current (AC) current sensing and measurement as illustrated in the examples below.

Those in the art will appreciate that the electronic circuitry proposed requires an appropriate isolation scheme to isolate the system voltage of the electrical power system 100 from the electronics. Once determined, current data can be transmitted to a remote location, via, for example, optical or wireless communication systems, although other types of communication are possible if desired.

Figure 3:
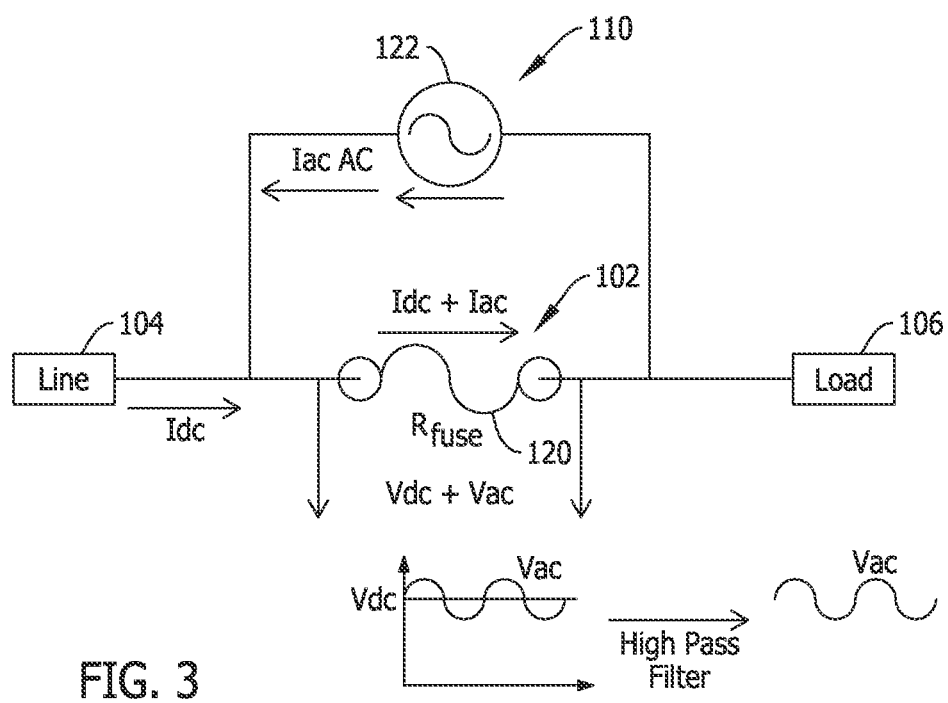
FIG. 3 is a partial circuit schematic of a portion of an electrical power system illustrating a second exemplary current sensing technique according to an embodiment of the present invention.

FIG. 3 is a partial circuit schematic of a portion of an electrical power system illustrating a second exemplary current sensing technique according to an embodiment of the present invention.

As shown in FIG. 3, line side circuitry 104 delivers an input $I_{dc}$ to the fuse 102 including a fuse element 120. The circuit 110 is connected in electrical parallel with the fuse element 120, and the circuit 110 includes a current source 122 that injects an AC current injection $I_{ac}$ at a preset frequency. Applying Ohm's law, the following relationships apply:

$$R_{fuse} = \frac{V_{ac}}{I_{ac}}$$

$$I_{dc} = \frac{V_{dc}}{R_{fuse}}$$

The current flowing through the fuse element 120 is the sum of $I_{dc}$ and $I_{ac}$, and the sensed voltage across the fuse element 120 is the sum of $V_{ac}$ and $V_{dc}$. As seen in FIG. 3, the sensed voltage may be subjected to a high pass filter to obtain the voltage $V_{ac}$. $R_{fuse}$ can now be determined as $V_{ac}$ and $I_{ac}$ are both known. Once $R_{fuse}$ is known, $I_{dc}$ can be calculated since $V_{dc}$ is known. The relationships and calculations may be repeated at any desired time interval to account for non-linear resistance behavior of the fuse element over time.

Figure 4:
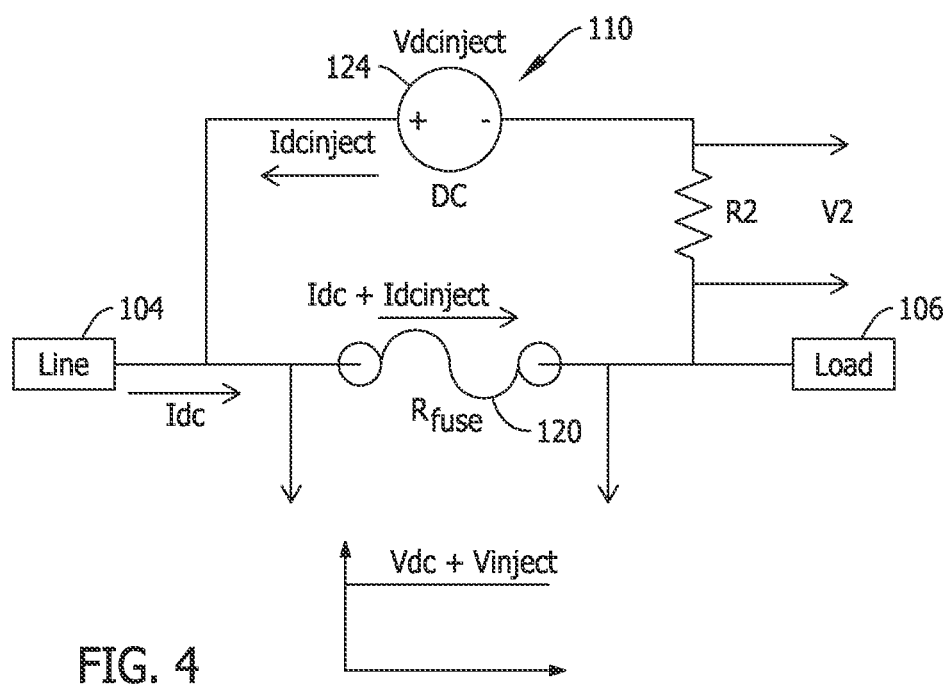
FIG. 4 is a partial circuit schematic of a portion of an electrical power system illustrating a third exemplary current sensing technique according to an embodiment of the present invention.

FIG. 4 is a partial circuit schematic of a portion of an electrical power system illustrating a third exemplary current sensing technique according to an embodiment of the present invention.

As shown in FIG. 4, line side circuitry 104 delivers an input current $I_{dc}$ to the fuse 102 including a fuse element 120. The circuit 110 is connected in electrical parallel with the fuse element 120, and the circuit 110 includes a voltage source 124 with known voltage $V_{dcinject}$ and generating current $I_{dcinject}$. A voltage dividing resistor $R_2$ is also present and a voltage $V_2$ is sensed across the resistor $R_2$. Applying Ohm's law, the following relationships apply to sense and determine the current $I_{dc}$:

$$I_{dcinject} = \frac{V_2}{R_2}$$

$$R_{fuse} = \frac{V_{dcinject} - V_2}{I_{dcinject}}$$

$$V_{dc} = V_{fuse} - V_{inject} = V_{fuse} - R_{fuse} * I_{dcinject}$$

$$I_{dc} = \frac{V_{dc}}{R_{fuse}}$$

The relationships and calculations may be repeated at any desired time interval to account to non-linear resistance behavior of the fuse element over time.

Figure 5:
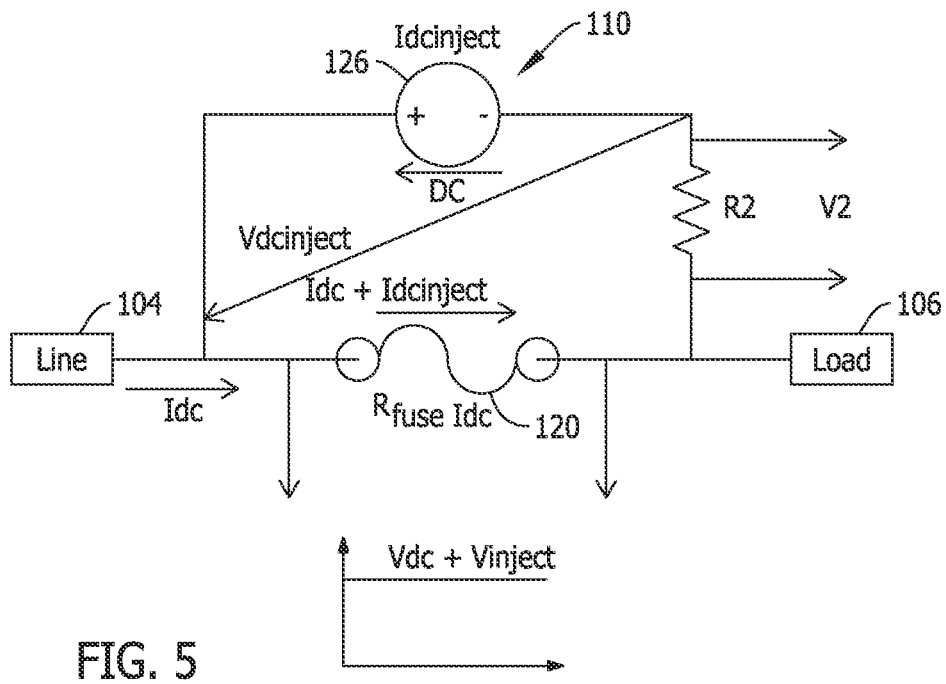
FIG. 5 is a partial circuit schematic of a portion of an electrical power system illustrating a fourth exemplary current sensing technique according to an embodiment of the present invention.

FIG. 5 is a partial circuit schematic of a portion of an electrical power system illustrating a fourth exemplary current sensing technique according to an embodiment of the present invention.

As shown in FIG. 5, line side circuitry 104 delivers an input current $I_{dc}$ to the fuse 102 including a fuse element 120. The circuit 110 is connected in electrical parallel with the fuse element 120, and the circuit 110 includes a DC current source 126 providing current $I_{dcinject}$ and generating voltage $V_{dcinject}$. A voltage dividing resistor $R_2$ is also present and a voltage $V_2$ is sensed across the resistor $R_2$. Applying Ohm's law, the following relationships apply to sense and determine the current $I_{dc}$:

$$R_{fuse} = \frac{V_{dcinject} - V_2}{I_{dcinject}}$$

$$V_{dc} = V_{fuse} - V_{inject} = V_{fuse} - R_{fuse} * I_{dcinject}$$

$$I_{dc} = \frac{V_{dc}}{R_{fuse}}$$

The relationships and calculations may be repeated at any desired time interval to account to non-linear resistance behavior of the fuse element over time.

Figure 6:
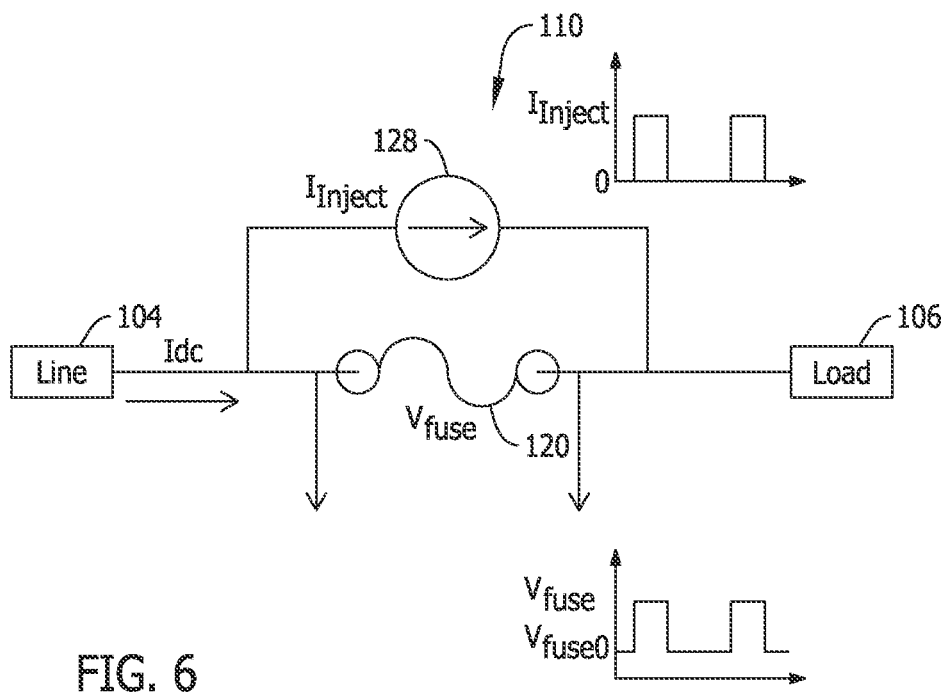
FIG. 6 is a partial circuit schematic of a portion of an electrical power system illustrating a fifth exemplary current sensing technique according to an embodiment of the present invention.

FIG. 6 is a partial circuit schematic of a portion of an electrical power system illustrating a fifth exemplary current sensing technique according to an embodiment of the present invention.

As shown in FIG. 6, line side circuitry 104 delivers an input current $I_{dc}$ to the fuse 102 including a fuse element 120. The circuit 110 is connected in electrical parallel with the fuse element 120, and the circuit 110 includes a pulsed current source 128 providing current $I_{inject}$. Applying Ohm's law, the following relationships apply to sense and determine the current $I_{dc}$:

When pulse current is zero, then $$V_{fuse0} = R_{fuse} * I_{dc}$$

When pulse current is $I_{inject}$, then $$V_{fuse} = R_{fuse} * (I_{dc} + I_{inject})$$

So $$\frac{V_{fuse}}{V_{fuse0}} = \frac{I_{dc} + I_{inject}}{I_{dc}}$$

$$I_{dc} = \frac{V_{fuse0} * I_{inject}}{V_{fuse} - V_{fuse0}}$$

The relationships and calculations may be repeated at any desired time interval to account to non-linear resistance behavior of the fuse element over time.

Figure 7:
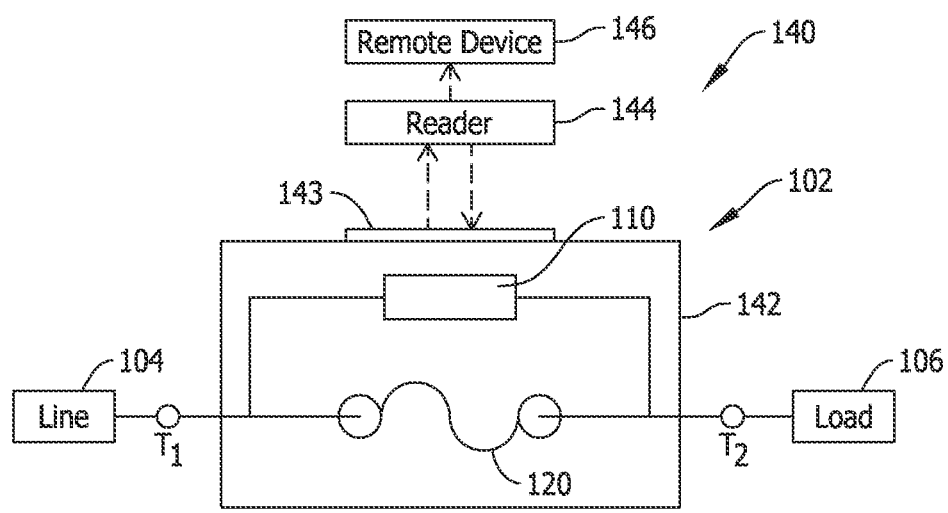
FIG. 7 schematically represents a first exemplary current sensing system according to an embodiment of the present invention.

FIG. 7 schematically represents a first exemplary current sensing system 140 according to an embodiment of the present invention. The system 140 includes the fuse 102 including the fuse element 120 and the circuitry 110 connected in parallel with the fuse element 120 inside a fuse housing 142. The fuse housing 142 is provided with fuse terminals $T_1$ and $T_2$ for establishing electrical connection with the line side circuitry 104 and the load side circuitry 106.

The fuse element 120 may be provided in any structural shape and configuration desired and may be designed to open in response to any overcurrent condition desired. The housing 142 may likewise be provided in any shape desired, including but not necessarily limited to round cylindrical shapes and rectangular shapes, and may be filled with an arc-extinguishing media. The fuse terminals $T_1$ and $T_2$ may be any known fuse terminal shape and configuration, including but not necessarily limited to end caps or ferrules, knife blade contacts, or terminal blades. In some contemplated embodiments the fuse 102 may be configured as a CUBE-Fuse® modular fuse of Bussmann by Eaton, St. Louis, Mo. having a rectangular housing and terminal blades projecting from a common side of the rectangular housing. Regardless, and as shown in FIG. 7, the compensation circuit 110 is embedded in the fuse construction. That is, the circuit 110 and electronics such as those described above are inside the fuse housing 142 and are accordingly built-in to the fuse.

A reader device 144 is shown as a separately provided device in the system 150. The reader device 144 may be a portable device in some embodiments or may be mounted stationary in other embodiments. In some embodiments the reader device 144 may be hand-held device. The reader device 144 may be a processor-based device and may communicate wirelessly with the circuitry 110 to receive the sensed voltage information or other data needed to analyze or calculate the current being sensed in the manner described above. While wireless communication between the circuitry 110 and the reader device 144 is beneficial in a large electrical power system 100, it is not in all cases strictly necessary and the reader device 144 may instead be hard-wired to the circuitry 110 via connecting ports and terminals in the fuse 102 if desired.

The reader device 144 in a contemplated embodiment may be configured as an RFID reader or interrogator device. In such an embodiment, once the information is obtained from a corresponding RFID element in the circuit 110, the current of interest can be calculated by the reader device 144, or in an embodiment wherein the current is calculated within the electronics embedded in the fuse 102, the calculated current can simply be communicated to the reader device 144.

As previously mentioned, the fuse 102 may be provided with an RFID label or bar code label 143 on the housing 142 of the fuse 102. The label 143 may include encoded information to be communicated to a reader device 144. The reader device 144 may accordingly be a multi-functional device including multiple means of communicating with elements of the fuse. The RFID label or bar code label may include identifying information for the fuse 102, rating information for the fuse 102, and coded information facilitating the calculation of the sensed current. As such, by reading the label or bar code on the fuse housing, the reader device 144 can know which one of multiple predetermined algorithms to use to calculate the current, and the reader device may also obtain any coefficients that may be unique the fuse 102 for use in the algorithm. In such a scenario, the reader device 144 is an intelligent device that can distinguish different types of fuses and select one of a variety of predetermined algorithms to calculate the sensed current.

Once obtained, the information obtained by the reader device 144, including the calculated current, can further be communicated to a remote device 146 via any desired communication network. The remote device 146 may facilitate monitoring and oversight of the electrical power system 100 and any related processes. The remote device 146 may, for example, be part of a Supervisory Control and Data Acquisition (SCADA) system monitoring aspects of an industrial facility and processes as those in the art may appreciate.

It is appreciated that in some embodiments the sensed current could actually be calculated by the remote device 146 at the remote location if desired, with the reader device 144 supplying only the information needed to make the calculation. Varying degrees of sophistication and complexity in the reader device 144 can be provided in the system 140 proposed at varying cost.

Figure 8:
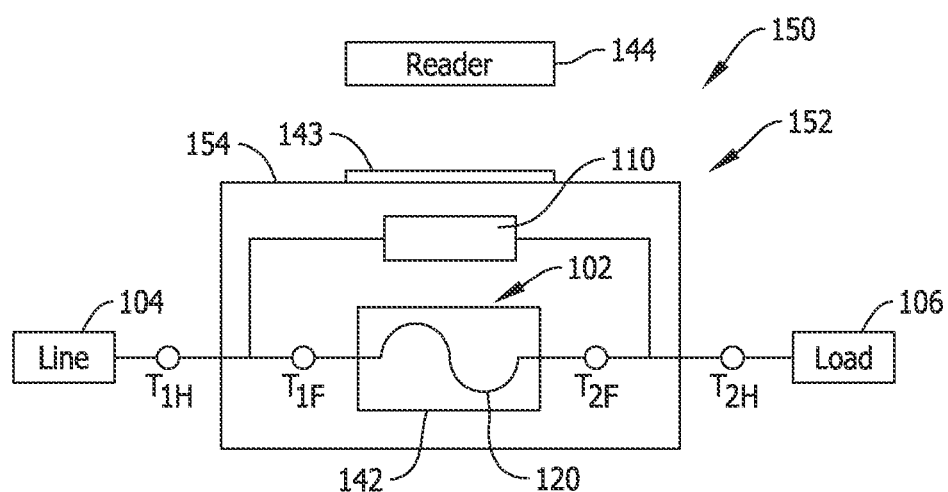
FIG. 8 schematically represents a second exemplary current sensing system according to an embodiment of the present invention.

FIG. 8 schematically represents a second exemplary current sensing system 150 according to another embodiment of the present invention. The system 150 includes a fuse holder or fuse block 152 including a housing 154 provided with terminals $T_{1H}$ and $T_{2H}$ respectively configured to structurally establish electrical connection to the line-side and load-side circuitry 104, 106. The terminals $T_{1F}$ and $T_{2F}$ of the fuse 102 are configured to structurally mate with the terminals $T_{1H}$ and $T_{2H}$ of the fuse holder or fuse block 152 such that an electrical connection between the line-side and load-side circuitry is established through the fuse element 120.

Unlike the system 140 (FIG. 7), the circuitry 110 is not provided in the housing 142 of the fuse, but is instead provided on or in the housing 154 of the fuse holder or fuse block 152. As such, the circuitry 110 in this embodiment is embedded in the fuse block 152 instead of in the fuse 102. The operation of the circuitry 110, however, remains the same, and the label 143 and reader 144 may also be provided as described above with similar effect.

In an alternative embodiment wherein the circuitry 110 is embedded in the fuse 102 as described above in the system 140, the reader 144 could be embedded in the fuse block or housing 152.

The fuse holder or fuse block housing 154 may be provided with multiple sets of terminals $T_{1H}$ and $T_{2H}$ such that multiple sets of fuses 102 can be accommodated in the fuse housing or fuse block 152. The housing 154 may be provided in a single piece or in multiple pieces, and may be provided in modular pieces that may be attached to one another. The housing 154 may be configured as an open-style fuse block or may partly or completely enclose the fuse(s) 102 as desired.

The terminals $T_{1H}$ and $T_{2H}$ provided on the housing 154 may include resilient spring clips that are structurally configured to receive and retain the terminals $T_{1F}$ and $T_{2F}$ of the fuse 102. The fuse terminals $T_{1F}$ and $T_{2F}$ may be provided in any shape and structural configuration, including but not necessarily limited to end caps or ferrules, knife blade contacts, or terminal blades. The terminals $T_{1H}$ and $T_{2H}$ on the fuse holder or fuse block housing may accordingly be varied to mate with the terminals $T_{1F}$ and $T_{2F}$ of the fuse 102. Fuse rejection features may be built-in to the terminals $T_{1F}$ and $T_{2F}$ of the fuse 102 and/or may be incorporated into the housing 154 to prevent installation of an incompatible fuse.

The terminals $T_{1H}$ and $T_{2H}$ provided on the housing 154 also include terminal features such as box lugs, spring clamps, or other terminals configured to accept and retain an end of a wire utilized to establish the line and load-side electrical connections to the fuse block or housing 152. Alternatively, panel mount clips and the like, as well as another terminal structure to establish mechanical and electrical connection to the line and load circuitry 104, 106 may be provided.

Figure 9:
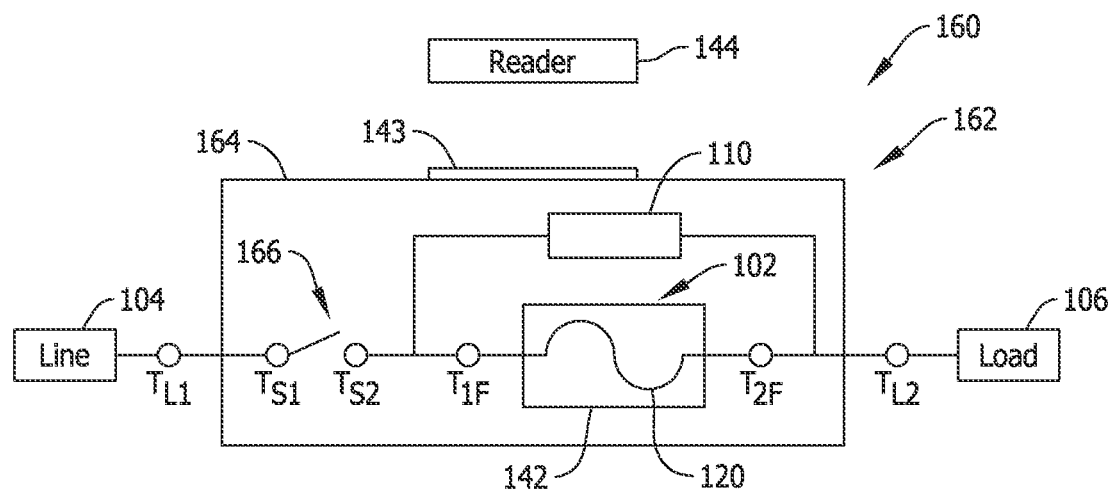
FIG. 9 schematically represents a third exemplary current sensing system according to an embodiment of the present invention.

FIG. 9 schematically represents a third exemplary current sensing system 160 according to an embodiment of the present invention. The system 160 includes a fusible disconnect switch device 162 including a housing or base 164 provided with terminals $T_{1L}$ and $T_{2L}$ respectively configured to structurally establish electrical connection to the line-side and load-side circuitry 104, 106. A switch 166 is provided in the housing or base 164 that may be selectively opened or closed to make or break the current path through the disconnect switch device 162, and when the fuse 102 is installed and the switch 166 is closed, the fuse element 120 of the fuse 102 completes an electrical connection between the line and load-side circuitry 104, 106. The base 164 may in some embodiments be configured as a Compact Circuit Protector (CCP) of Bussmann by Eaton, St. Louis, Mo. As can be seen in the schematic of FIG. 9, the disconnect switch device 162 does not include an in-line circuit breaker and is accordingly smaller than conventional in-line circuit breaker and fuse combinations.

The terminals $T_{1F}$ and $T_{2F}$ of the fuse 102 are configured to structurally mate with complementary terminals of the base 164 such that an electrical connection may be established through the fuse element 120. The complementary terminals of the base 164 may include resilient spring clips that are structurally configured to receive and retain the terminals $T_{1F}$ and $T_{2F}$ of the fuse 102. The fuse terminals $T_{1F}$ and $T_{2F}$ may be provided in any shape and structural configuration, including but not necessarily limited to end caps or ferrules, knife blade contacts, or terminal blades. The complementary terminals on the fuse holder or fuse block housing may accordingly be varied to mate with the terminals $T_{1F}$ and $T_{2F}$ of the fuse 102. Fuse rejection features may be built-in to the terminals $T_{1F}$ and $T_{2F}$ of the fuse 102 and/or may be incorporated into the housing 154 to prevent installation of an incompatible fuse. When the fuse 102 is installed, the switch 166 may be operated to connect or disconnect the electrical connection through the fuse element 120 and between the line-side and load-side circuitry 104, 106. As such, the switch 166 provides a connection and disconnection of the circuit path through the device 162 while the fuse 102 remains in place.

In the embodiment shown in FIG. 9, the circuitry 110 is not provided in the housing 142 of the fuse 102, but is instead provided on or in the base 164 of the switch disconnect device 162. As such, the circuitry 110 in this embodiment is embedded in the base 162 instead of in the fuse 102. The operation of the circuitry 110, however, remains the same, and the label 143 and reader 144 may also be provided as described above with similar effect.

In an alternative embodiment wherein the circuitry 110 is embedded in the fuse 102 as described above in the system 140, the reader 144 could be embedded in the base 164.

The base 164 may be provided with multiple sets of terminals such that multiple sets of fuses 102 can be accommodated. The base 164 may be provided in a single piece or in multiple pieces, and may be provided in modular pieces that may be attached to one another. The base 164 may partly or completely enclose the fuse(s) 102 as desired.

Terminals $T_{1L}$ and $T_{2L}$ provided on the base 164 also include terminal features such as box lugs, spring clamps, or other terminals configured to accept and retain an end of a wire utilized to establish the line and load-side electrical connections to the disconnect switch device 162. Alternatively, panel mount clips and the like, as well as another terminal structure to establish mechanical and electrical connection to the line and load circuitry 104, 106 may be provided.

Figure 10:
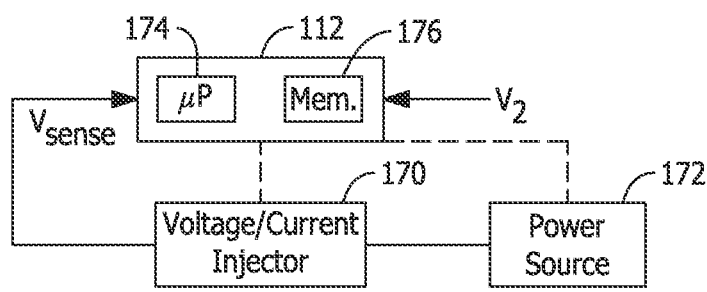
FIG. 10 schematically illustrates compensation circuitry for the current sensing techniques and systems shown in FIGS. 2-9.

FIG. 10 schematically illustrates the compensation circuitry 110 discussed in the embodiments above. The circuitry 110 includes a voltage/current source 170 and a power source or power supply 172. In the exemplary embodiments described, the voltage/current source corresponds to the element 122 (FIG. 3), the element 124 (FIG. 4), the element 126 (FIG. 5), or the element 128 (FIG. 6). In different embodiments, the power source 172 may be derived from the line-side of the electrical system 100, the power source 172 may be a stand alone power-supply (e.g., and energy storage element such as a battery or supercapacitor), or the power supply 172 may correspond to a self-powered, power harvesting device. The power source 172 may optionally be coupled to the controller 112.

The controller 112 as shown includes a processor 174 and a memory storage 176 wherein executable instructions, commands, and control algorithms, as well as other data and information required to satisfactorily sense and calculate the current flowing the fuse 102 are stored. The memory 176 of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM).

As described above, when the controller 112 is provided an input for the voltage $V_{sense}$ across the fuse 102 as shown and described in FIG. 2 and in the more specific implementations shown and described in FIGS. 3-6, and optionally when the controller 112 is provided the input $V_2$ shown and described in the embodiments of FIGS. 4 and 5, the relationships derived from Ohm's law can be evaluated and applied in algorithmic form to determine the current $I_{sense}$ as shown and described in FIG. 2 and in the more specific implementations shown and described in FIGS. 3-6. It is understood, however, that as discussed above, the controller 112 in the circuitry 110 is optional when another controller, such as the controller 114 shown and described in FIG. 2, is available to receive the voltage input(s) and make the calculations. It is likewise understood that in some embodiments the current calculation is made by another processor-based entirely, such as the reader 144 or remote device 146 described above.

Figure 11:
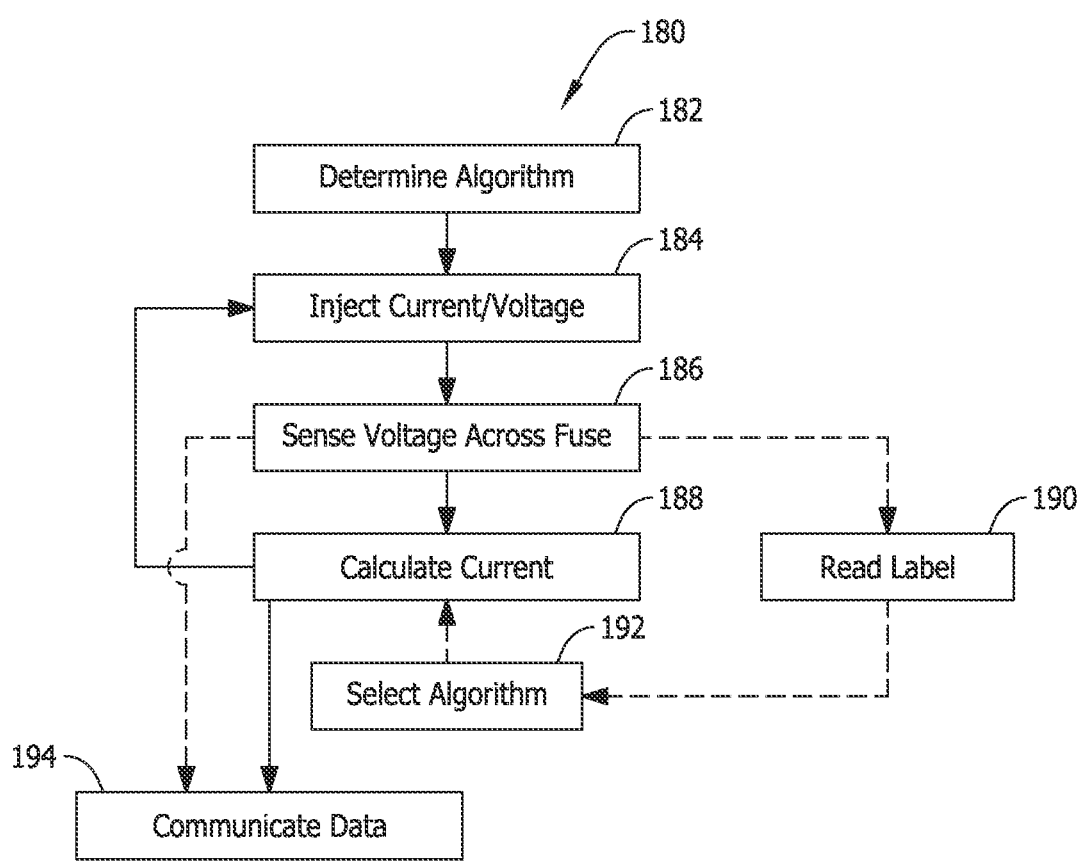
FIG. 11 is a method flowchart illustrating exemplary processes associated with the current sensing techniques, systems, and circuitry shown in FIGS. 2-10.

FIG. 11 is a method flowchart illustrating exemplary processes associated with the current sensing techniques, systems, and circuitry shown in FIGS. 2-10.

As shown in FIG. 11, the method includes at step 180 determining the algorithm to calculate the resistance, and also the current flowing through a non-linear resistance element such as the fuse element 120 in the embodiments described above. Exemplary relationships that may be implemented in algorithms are described above in relation to FIGS. 2-6. The embodiments described herein are, however, merely examples that are provided for the sake of illustration rather than limitation. Other relationships than those described can be used with circuitry other than that specifically described herein in further and/or alternative embodiments of the invention.

Once the algorithm is determined 182, it can be programmed in a processor-based device such as those described above. Having now described various specific implementation circuitry and relationships for exemplary algorithms, those in the art could implement and program the algorithm without further explanation. A plurality of algorithms are contemplated for specific use with respectively different types of fuses and different types of circuitry utilized to implement the measuring and calculation of the fuse element resistance.

At step 184, the current or voltage in the circuitry 110 is applied, which injects current or voltage that can be used to calculate the fuse resistance and the current as explained above.

At step 186, the voltage is sensed across the fuse element, and at step 188 the current may be calculated based on the sensed voltage utilizing the appropriate algorithm determined at step 182. In some cases, a second voltage such as the voltage $V_2$ shown and described in relation to the embodiments of FIGS. 4 and 5 may also be sensed and utilized to calculate the current. The actual calculation can be made by any of the processor-based devices described above.

As optionally shown at step 190, the method may further include reading a label 190 to obtain identifying information for the fuse and any information needed to make the calculation. Also, optionally shown as step 192 the method may include selecting the appropriate algorithm 192 based on information received from reading the label. In contemplated embodiments, the steps 190 and 192 may be performed by the reader device 140 and/or the remote device 146 described above. The steps 184, 186, 188, 190 and 192 may be repeated at regular or irregular time intervals to account for the non-linear resistance behavior of the fuse element.

As shown at step 194, the sensed voltage data may optionally be communicated to another device such as the reader device as described above. The calculated current may likewise be communicated at step 194 to another device such as the reader device or to a remote device according to the examples described above. Variations of the examples described are possible, however, as well as alternative embodiments that are extensions of the concepts disclosed herein.

The advantages and benefits of the invention are now believed to have been amply demonstrated in the exemplary embodiments disclosed.

An embodiment of an electrical current sensing system has been disclosed including: a conductor having a non-linear resistance when connected to an electrical power system; a compensation circuit connected in parallel with the conductor and configured to introduce at least one of a voltage and a current to the conductor; and a processor receiving a first voltage sensed across the conductor, the processor configured to determine a current flowing through the conductor based on the received first voltage.

Optionally, the conductor may be a fuse element. The fuse element may be contained in a fuse housing, and the compensation circuit may also be contained in the fuse housing. The sensing system in one embodiment may further include a fuse holder, and the compensation circuit may be provided on the fuse holder. The sensing system in another embodiment may further include a disconnect switch, and the compensation circuit may be provided on the disconnect switch. The sensing system may include a reader device configured to communicate with the compensation circuitry, and may also include a label associated with the conductor, with the reader device configured to read the label and utilize information from the label to determine the current flowing through the conductor.

As further options, the compensation circuitry may include a stand-alone power supply, and the compensation circuit may be configured to introduce an alternating current to the conductor. The compensation circuit may include a voltage dividing resistor, wherein the processor receives a second voltage sensed across the voltage dividing resistor, and the processor device is configured to determine a current flowing through the conductor based on the received first and second voltages.

Another embodiment of an electrical current sensing system has been disclosed including: an electrical fuse including a housing, first and second terminal elements, and a fuse element having a non-linear resistance when connected to an electrical power system; a compensation circuit connected in parallel with the fuse element and configured to introduce at least one of a voltage and a current to the fuse element; and a processor receiving a first voltage sensed across the fuse element, the processor configured to determine a current flowing through the fuse element based on the received first voltage.

Optionally, the compensation circuit is contained in the fuse housing. The sensing system may further include a fuse holder, and the compensation circuit may be provided on the fuse holder. The electrical current sensing system may also include a disconnect switch, and the compensation circuit may be provided on the disconnect switch. The electrical current sensing system may further include a reader device configured to communicate with the compensation circuitry, and a label may be associated with the electrical fuse, the reader device configured to read the label and utilize information from the label to determine the current flowing through the conductor. The compensation circuit may include a voltage dividing resistor, wherein the processor receives a second voltage sensed across the voltage dividing resistor, and the processor device is configured to determine a current flowing through the fuse element based on the received first and second voltages.

A method of sensing current in an electrical power system has also been disclosed. The method includes: providing a conductor having a non-linear resistance when connected to an electrical power system; connecting a compensation circuit in electrical parallel with the conductor; injecting one of a voltage or current to the conductor with the compensation circuit; sensing the voltage across the conductor; and calculating the current flowing through the conductor based on the sensed voltage across the conductor.

Optionally, providing the conductor having a non-linear resistance when connected to an electrical power system includes providing an electrical fuse including a fuse element, and wherein connecting the compensation circuit in electrical parallel with the conductor comprises connecting the compensation circuit in electrical parallel with the fuse element. The fuse may include a fuse housing, and connecting the compensation circuit in electrical parallel with the fuse element may include connecting the compensation circuit inside the fuse housing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical current sensing system comprising:
   a fuse housing and a fuse element in the fuse housing, the fuse element having a non-linear resistance when connected to an energized line side circuit of an electrical power system;
   a compensation circuit connected in parallel with the fuse element and including a voltage or current source that injects a current or voltage across the fuse element while an electrical current is flowing through the fuse element from the energized line side circuit, wherein the voltage or current source is configured to inject the current or voltage across the fuse element independently from the energized line side circuit; and
   a processor-based control device configured to:
      receive a first voltage sensed across the fuse element while the voltage or current source injects the current or the voltage across the fuse element,
      determine a resistance of the fuse element in reference to the injected current or voltage while the electrical current is flowing through the fuse element from the energized line side circuit and while the voltage or current source injects the current or the voltage across the fuse element; and
      calculate the electrical current flowing through the fuse element from the energized line side circuit based on the received first voltage and the determined resistance of the fuse element.

2. The electrical current sensing system of claim 1, wherein the compensation circuit is inside the fuse housing.

3. The electrical current sensing system of claim 1, wherein the compensation circuit is provided on a fuse holder and is exterior to the fuse housing.

4. The electrical current sensing system of claim 1, wherein the compensation circuit is provided on a disconnect switch and is exterior to the fuse housing.

5. The electrical current sensing system of claim 1, further comprising a processor-based reader device in communication with the compensation circuit.

6. The electrical current sensing system of claim 5, further comprising a label associated with the fuse element, the processor-based reader device configured to read the label and utilize information from the label to calculate the electrical current flowing through the fuse element from the energized line side circuit.

7. The electrical current sensing system of claim 1, wherein the compensation circuit includes a stand-alone power supply that is not derived from the energized line side circuit.

8. The electrical current sensing system of claim 1, wherein the compensation circuit includes an alternating current source.

9. The electrical current sensing system of claim 1, wherein the compensation circuit includes a voltage dividing resistor, wherein the processor-based control device further receives a second voltage sensed across the voltage dividing resistor, and the processor-based control device is further configured to calculate the electrical current flowing through the fuse element from the energized line side circuit based on the received first voltage, the received second voltage, and the determined resistance.

10. A method of sensing current flow in an electrical power system via an electrical fuse including a fuse element having a non-linear resistance when connected to an energized line side circuit of the electrical power system and a compensation circuit electrically connected in parallel with the fuse element, the method comprising:
   injecting, by the compensation circuit, a voltage or current across the fuse element while an electrical current is flowing through the fuse element from the energized line side circuit, wherein the injected voltage or current is independent from the electrical current flowing from the energized line side circuit;
   sensing the voltage across the fuse element while the voltage or current is being injected across the fuse element;
   determining, by at least one processor-based control device, a resistance of the fuse element in reference to the injected current or voltage while the electrical current is flowing through the fuse element from the energized line side circuit and while the current or the voltage is injected across the fuse element; and
   calculating, by the at least one processor-based control device, the electrical current flowing through the fuse element from the energized line side circuit based on the sensed voltage across the fuse element and the determined resistance of the fuse element.

11. The method of claim 10, wherein the electrical fuse includes a fuse housing, and the method further comprises providing the compensation circuit electrically connected in parallel with the fuse element inside the fuse housing.

12. The electrical current sensing system of claim 1, wherein the compensation circuit is configured to inject only a direct current.

13. The electrical current sensing system of claim 1, wherein the compensation circuit is configured to inject only a direct current voltage.

14. The electrical current sensing system of claim 1, wherein the compensation circuit is configured to inject only a pulsed current.

15. The electrical current sensing system of claim 5, further comprising a remote device in communication with the reader device.

16. The electrical current sensing system of claim 15, wherein the remote device is part of a Supervisory Control and Data Acquisition (SCADA) system.

17. The electrical current sensing system of claim 5, wherein the processor-based reader device wirelessly communicates with the compensation circuit.

18. The electrical current sensing system of claim 1, wherein the processor-based control device is included in the compensation circuit.

19. The electrical current sensing system of claim 1, wherein the compensation circuit injects an alternating current only.

20. The method of claim 10, wherein injecting, by the compensation circuit, a voltage or current across the fuse element comprises injecting a direct current only.

21. The method of claim 10, wherein injecting, by the compensation circuit, a voltage or current across the fuse element comprises injecting a direct current voltage only.

22. The method of claim 10, wherein injecting, by the compensation circuit, a voltage or current across the fuse element comprises injecting a pulsed current only.

23. The method of claim 10, wherein injecting, by the compensation circuit, a voltage or current across the fuse element comprises injecting an alternating current only.

24. The method of claim 10, further comprising wirelessly communicating the calculated electrical current.

25. The method of claim 10, further comprising providing the compensation circuit in a fuse holder that is configured to accept the electrical fuse.

26. The method of claim 10, further comprising providing the compensation circuit in a disconnect switch that is configured to accept the electrical fuse.

* * * * *